United States Patent
Yokoo (10) Patent No.: US 11,556,050 B2
(45) Date of Patent: Jan. 17, 2023

(54) WAVELENGTH CONVERSION ELEMENT, LIGHT SOURCE DEVICE, AND PROJECTOR

(71) Applicant: SEIKO EPSON CORPORATION, Tokyo (JP)

(72) Inventor: Tomohiro Yokoo, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 17/104,634

(22) Filed: Nov. 25, 2020

(65) Prior Publication Data

US 2021/0165311 A1 Jun. 3, 2021

(30) Foreign Application Priority Data

Nov. 28, 2019 (JP) .............................. JP2019-215077

(51) Int. Cl.
| G03B 21/20 | (2006.01) |
| H04N 9/31 | (2006.01) |
| H01L 33/50 | (2010.01) |
| G02B 27/28 | (2006.01) |

(52) U.S. Cl.
CPC ......... *G03B 21/204* (2013.01); *G02B 27/283* (2013.01); *G03B 21/2013* (2013.01); *G03B 21/2066* (2013.01); *H01L 33/507* (2013.01); *H04N 9/3161* (2013.01); *H04N 9/3164* (2013.01)

(58) Field of Classification Search
CPC .............. G03B 21/204; G03B 21/2013; G03B 21/2006; H04N 9/3161; H04N 9/3164
USPC .......................................................... 353/31
See application file for complete search history.

(56) References Cited

U.S. PATENT DOCUMENTS

| 10,711,189 B2* | 7/2020 | Maeda ................. G03B 21/204 |
| 2011/0149549 A1 | 6/2011 | Miyake et al. |
| 2013/0106276 A1 | 5/2013 | Miyairi et al. |
| 2013/0257264 A1* | 10/2013 | Tamaki ................. H01L 33/502 313/503 |
| 2016/0348857 A1* | 12/2016 | Miyata ....................... F21V 9/38 |
| 2018/0231880 A1* | 8/2018 | Masuda ............... H04N 9/3158 |
| 2019/0041732 A1 | 2/2019 | Takagi et al. |
| 2019/0041733 A1 | 2/2019 | Takagi et al. |
| 2019/0072245 A1* | 3/2019 | Kobayashi ........... G03B 21/204 |
| 2019/0171093 A1 | 6/2019 | Furuyama et al. |
| 2019/0294033 A1 | 9/2019 | Yokoo et al. |

(Continued)

FOREIGN PATENT DOCUMENTS

| JP | 2011-129354 | 6/2011 |
| JP | 2013-118346 | 6/2013 |
| JP | 2013-195841 | 9/2013 |

(Continued)

*Primary Examiner* — Jerry L Brooks
(74) *Attorney, Agent, or Firm* — Dority & Manning, P.A.

(57) ABSTRACT

A wavelength conversion element according to the present disclosure includes a wavelength conversion layer having a first surface having a recessed part, and a plurality of air holes, and configured to be excited by light in a first wavelength band to thereby generate light in a second wavelength band different from the first wavelength band, a particle disposed in the recessed part, a light transmissive member disposed so as to cover the recessed part and the particle, a reflecting layer disposed so as to be opposed to the first surface of the wavelength conversion layer, and a base member disposed so as to be opposed to the reflecting layer.

10 Claims, 4 Drawing Sheets

(56) References Cited

U.S. PATENT DOCUMENTS

2020/0363709 A1\* 11/2020 Yang .................... G03B 21/208

FOREIGN PATENT DOCUMENTS

| JP | 2015-119046 | 6/2015 |
|----|-------------|--------|
| JP | 2017-138470 | 8/2017 |
| JP | 2018432549 | 8/2018 |
| JP | 2019-028386 | 2/2019 |
| JP | 2019-028430 | 2/2019 |
| JP | 2019464258 | 9/2019 |
| WO | WO2016/161557 | 10/2016 |
| WO | WO 2015/194455 | 4/2017 |
| WO | WO 2018/074132 | 4/2018 |

\* cited by examiner

WAVELENGTH CONVERSION ELEMENT, LIGHT SOURCE DEVICE, AND PROJECTOR

The present application is based on, and claims priority from JP Application Serial Number 2019-215077, filed Nov. 28, 2019, the disclosure of which is hereby incorporated by reference herein in its entirety.

BACKGROUND

1. Technical Field

The present disclosure relates to a wavelength conversion element, a light source device, and a projector.

2. Related Art

In recent years, some of illumination devices used for projectors use fluorescence as the illumination light. For example, in JP-A-2011-129354, there is disclosed an illumination device using the fluorescence. In this illumination device, by disposing a metal film (a reflecting layer) on a surface of a phosphor made of phosphor ceramics, the fluorescence generated by the phosphor is taken out by reflecting the fluorescence. In this illumination device, it is arranged to reduce air holes to be the factor for hindering thermal diffusion.

When forming the air holes inside the phosphor in order to diffuse the fluorescence generated in the phosphor, recessed parts due to the air holes are formed on the surface of the phosphor. When the recessed parts are formed on the surface of the phosphor, the reflecting member is not formed evenly due to the recessed parts when forming the reflecting member on the surface of the phosphor. Therefore, there is a possibility that the extraction efficiency of the fluorescence from the phosphor decreases due to the decrease in the reflectance of the reflecting member.

SUMMARY

In order to solve the problem described above, a wavelength conversion element according to an aspect of the present disclosure includes a wavelength conversion layer having a first surface having a recessed part, and a plurality of air holes, and configured to be excited by light in a first wavelength band to thereby generate light in a second wavelength band different from the first wavelength band, a particle disposed in the recessed part, a light transmissive member disposed so as to cover the recessed part and the particle, a reflecting layer disposed so as to be opposed to the first surface of the wavelength conversion layer, and a base member disposed so as to be opposed to the reflecting layer.

A light source device according to an aspect of the present disclosure includes the wavelength conversion element described above, and a light source configured to emit the light in the first wavelength band toward the wavelength conversion element.

A projector according to an aspect of the present disclosure includes the light source device described above, a light modulation device configured to modulate light from the light source device in accordance with image information to thereby form image light, and a projection optical system configured to project the image light.

DESCRIPTION OF AN EXEMPLARY EMBODIMENT

An embodiment of the present disclosure will hereinafter be described in detail with reference to the drawings.

It should be noted that the drawings used in the following description show characteristic parts in an enlarged manner in some cases for the sake of convenience in order to make the features easy to understand, and the dimensional ratios between the constituents and so on are not necessarily the same as actual ones.

An example of a projector according to the present embodiment will be described.

Figure 1:
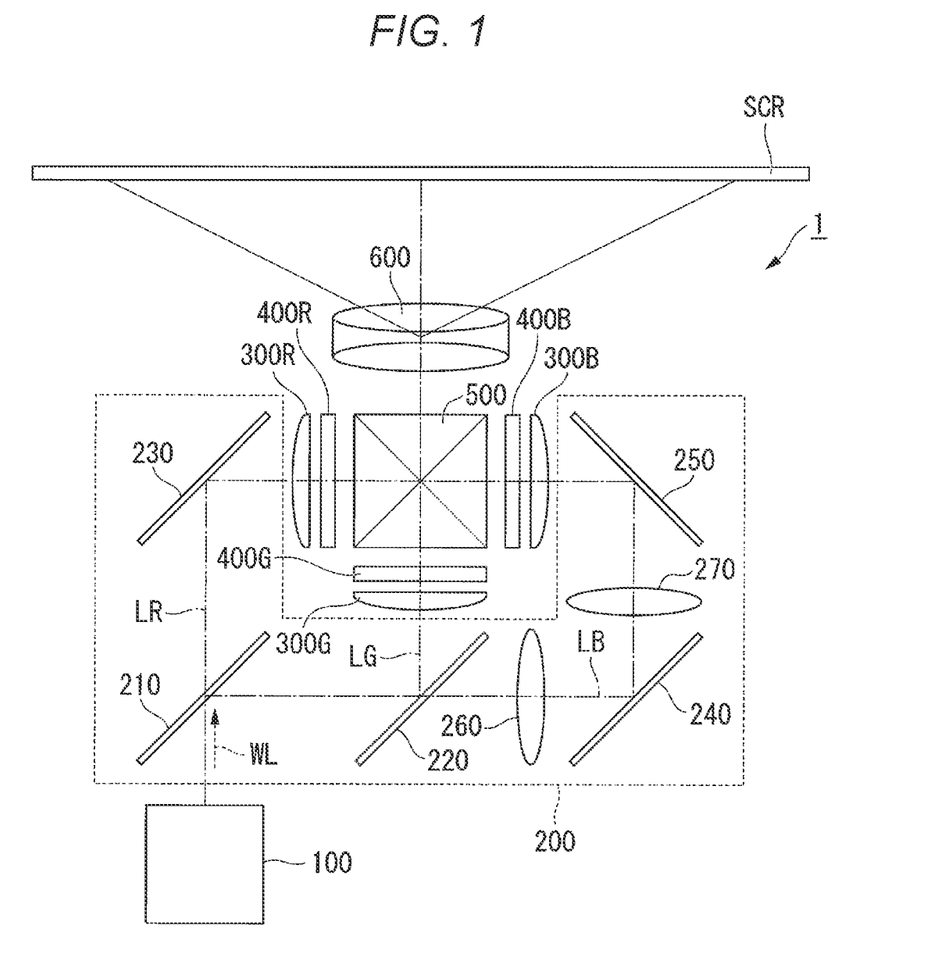
FIG. 1 is a diagram showing an outline of a projector.

FIG. 1 is a schematic diagram showing a configuration of the projector according to the present embodiment.

As shown in FIG. 1, the projector 1 according to the present embodiment is a projection-type image display device for displaying a color image on a screen SCR.

The projector 1 is provided with an illumination device 100, a color separation light guide optical system 200, light modulation devices 400R, 400G, and 400B, a cross dichroic prism 500, and a projection optical system 600.

In the present embodiment, the illumination device 100 emits illumination light WL having a white color toward the color separation light guide optical system 200.

The color separation light guide optical system 200 is provided with dichroic mirrors 210, 220, reflecting mirrors 230, 240, and 250, and relay lenses 260, 270. The color separation light guide optical system 200 separates the illumination light WL from the illumination device 100 into red light LR, green light LG, and blue light LB, and guides the red light LR, the green light LG, and the blue light LB to the corresponding light modulation devices 400R, 400G, and 400B, respectively.

Between the color separation light guide optical system 200 and the light modulation devices 400R, 400G, and 400B, there are disposed field lenses 300R, 300G, and 300B, respectively.

The dichroic mirror 210 is a dichroic mirror for transmitting the red light component while reflecting the green light component and the blue light component.

The dichroic mirror 220 is a dichroic mirror for reflecting the green light component while transmitting the blue light component.

The reflecting mirror 230 is a reflecting mirror for reflecting the red light component.

The reflecting mirrors 240, 250 are reflecting mirrors for reflecting the blue light component.

The red light LR having passed through the dichroic mirror 210 is reflected by the reflecting mirror 230, then passes through the field lens 300R, and then enters an image forming area of the light modulation device 400R for the red light.

The green light LG having been reflected by the dichroic mirror 210 is further reflected by the dichroic mirror 220, then passes through the field lens 300G, and then enters the image forming area of the light modulation device 400G for the green light.

The blue light LB having been transmitted through the dichroic mirror 220 enters the image forming area of the light modulation device 400B for the blue light via the relay lens 260, the reflecting mirror 240, the relay lens 270, the reflecting mirror 250, and the field lens 300B.

The light modulation devices 400R, 400G, and 400B are for modulating the respective colored light beams having entered the light modulation devices 400R, 400G, and 400B in accordance with image information to thereby form a color image corresponding to the colored light beams. It should be noted that, although not shown in the drawings, incident side polarization plates are disposed between the field lenses 300R, 300G, 300B and the light modulation devices 400R, 400G, 400B, respectively, and exit side polarization plates are disposed between the light modulation devices 400R, 400G, 400B and the cross dichroic prism 500, respectively.

The cross dichroic prism 500 is an optical element for combining the image light emitted from the respective light modulation devices 400R, 400G, 400B with each other to form the color image.

The cross dichroic prism 500 has a substantially rectangular planar shape composed of four rectangular prisms bonded to each other, and on the substantially X-shaped interfaces on which the rectangular prisms are bonded to each other, there are formed dielectric multilayer films.

The color image emitted from the cross dichroic prism 500 is projected in an enlarged manner by the projection optical system 600 to form an image on the screen SCR.

Figure 2:
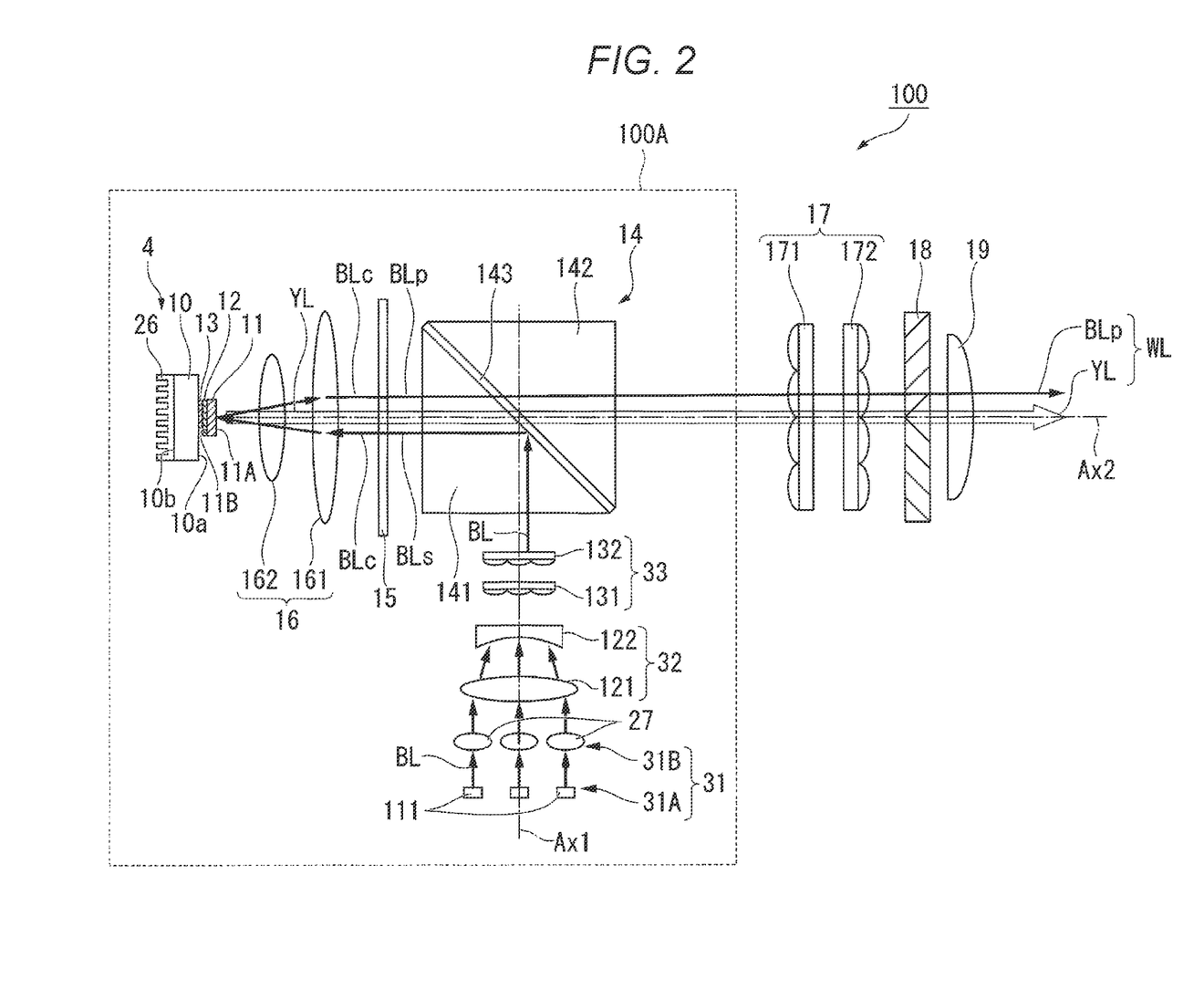
FIG. 2 is a diagram showing an outline of an illumination device.

FIG. 2 is a schematic view showing a configuration of the illumination device 100.

The illumination device 100 emits the illumination light WL toward the color separation light guide optical system 200 as described above. As shown in FIG. 2, the illumination device 100 is provided with a light source device 100A, an integrator optical system 17, a polarization conversion element 18, and a superimposing lens 19. The light source device 100A is provided with a light source section (a light source) 31, an afocal optical system 32, a homogenizer optical system 33, a polarization split device 14, a wave plate 15, a pickup optical system 16, and a wavelength conversion element 4. Further, the light source section 31 is provided with an array light source 31A and a collimator optical system 31B.

The array light source 31A of the light source section 31 is formed of a plurality of semiconductor lasers 111.

Specifically, the array light source 31A is formed of the plurality of semiconductor lasers 111 arranged in an array in a single plane perpendicular to an illumination light axis Ax1 of a light beam emitted from the array light source 31A. It should be noted that although described later in detail, denoting the illumination light axis of the light beam reflected by the wavelength conversion element 4 by Ax2, the illumination light axis Ax1 and the illumination light axis Ax2 are perpendicular to each other. On the illumination light axis Ax1, the light source section 31, the afocal optical system 32, the homogenizer optical system 33, and the polarization split device 14 are arranged in this order.

Meanwhile, on the illumination light axis Ax2, the wavelength conversion element 4, the pickup optical system 16, the wave plate 15, the polarization split device 14, the integrator optical system 17, the polarization conversion element 18, and the superimposing lens 19 are arranged in this order in the proceeding direction of fluorescence YL described later.

The semiconductor lasers 111 constituting the array light source 31A each emit the excitation light (the blue light BL) having a peak wavelength in the wavelength region of, for example, 440 through 480 nm. Further, the blue light BL emitted from each of the semiconductor lasers 111 is coherent linearly-polarized light, and is emitted toward the polarization split device 14 in parallel to the illumination light axis Ax1. In the present embodiment, the blue light BL corresponds to "light in a first wavelength band."

Further, the array light source 31A makes the polarization direction of the blue light BL emitted by each of the semiconductor lasers 111 coincide with the polarization direction of the polarization component (e.g., an S-polarization component) to be reflected by a polarization split layer 143 of the polarization split device 14. The blue light BL emitted from the array light source 31A enters the collimator optical system 31B.

The collimator optical system 31B is for converting the blue light BL having been emitted from the array light source 31A into parallel light. The collimator optical system 31B is provided with, for example, a plurality of collimator lenses 27 arranged in an array corresponding respectively to the semiconductor lasers 111. The blue light BL, which has passed through the collimator optical system 31B to thereby be converted into the parallel light, enters the afocal optical system 32.

The afocal optical system 32 adjusts the beam diameter of the blue light BL having entered the afocal optical system 32 from the collimator optical system 31B. The afocal optical system 32 is provided with a lens 121 and a lens 122. The blue light BL, which has passed through the afocal optical system 32 to thereby be adjusted in size, enters the homogenizer optical system 33.

The homogenizer optical system 33 homogenizes the illuminance distribution by the blue light BL in the illumination target area in cooperation with the pickup optical system 16 described later. The homogenizer optical system 33 is provided with a pair of multi-lens arrays 131, 132. The blue light BL having been emitted from the homogenizer optical system 33 enters the polarization split device 14.

The polarization split device 14 is a so-called prism-type polarization beam splitter (PBS), and transmits one of the P-polarized light and the S-polarized light, and reflects the other thereof. The polarization split device 14 is provided with prisms 141, 142, and the polarization split layer 143. These prisms 141, 142 are each formed to have a substantially triangular prism shape, and each have a tilted surface having an angle of 45° with the illumination light axis Ax1 and an angle of 45° with the illumination light axis Ax2.

The polarization split layer 143 is disposed on the tilted surface described above, and has a polarization split function of splitting the blue light BL in the first wavelength band having entered the polarization split layer 143 into the S-polarization component and the P-polarization component. The polarization split layer 143 reflects the S-polarization component of the blue light BL, and transmits the P-polarization component of the blue light BL.

Further, the polarization split layer 143 has a color separation function of transmitting light in a second wavelength band (the green light LG and the red light LR) different from the first wavelength band (the wavelength band of the blue light BL) out of the light having entered the polarization split layer 143 irrespective of the polarization state thereof. It should be noted that the polarization split device 14 is not limited to the prism-type device, but a plate-type polarization split device can also be used.

In the present embodiment, the blue light BL having entered the polarization split layer 143 coincides in polarization direction with the S-polarization component, and is therefore reflected toward the wavelength conversion element 4 as S-polarized excitation light (hereinafter referred to as blue light BLs).

The wave plate 15 is a ¼ wave plate disposed in the light path between the polarization split layer 143 and the wavelength conversion element 4. The blue light BLs as the S-polarized light entering the wave plate 15 is converted into blue light BLc as circularly polarized light, and then enters the pickup optical system 16. It should be noted that the wave plate 15 can also be a ½ wave plate.

The pickup optical system 16 converges the blue light BLc toward the wavelength conversion element 4. The pickup optical system 16 is provided with a lens 161 and a lens 162. Specifically, the pickup optical system 16 converges the plurality of light beams (the blue light BLc) having entered the pickup optical system 16 toward the wavelength conversion element 4 described later, and at the same time superimposes the light beams on each other on the wavelength conversion element 4.

The blue light BLc from the pickup optical system 16 enters the wavelength conversion element 4. The wavelength conversion element 4 is excited by a part of the blue light BLc to thereby generate the fluorescence YL including the red light and the green light. The fluorescence YL has a peak wavelength in a wavelength region of, for example, 500 through 700 nm. It should be noted that the configuration of the wavelength conversion element 4 will be described later. A part of the blue light BLc is reflected by the wavelength conversion element 4 as described later. In the present embodiment, the fluorescence YL corresponds to "light in a second wavelength band." It should be noted that a part of the fluorescence YL is also reflected by the wavelength conversion element 4.

Then, the fluorescence YL having been emitted from the wavelength conversion element 4 and the blue light BLc having been reflected by the wavelength conversion element 4 pass through the pickup optical system 16 and the wave plate 15, and then enter the polarization split device 14. Here, the blue light BLc passes the wave plate 15 once again to turn to blue light BLp as P-polarized light. The blue light BLp is transmitted through the polarization split layer 143. Further, the fluorescence YL is transmitted through the polarization split layer 143. The fluorescence YL and the blue light BLp (the P-polarized blue light) are combined with each other to generate the illumination light WL having a white color. The illumination light WL enters the integrator optical system 17.

The integrator optical system 17 homogenizes the illuminance distribution in the illumination target area in cooperation with the superimposing lens 19 described later. The integrator optical system 17 is provided with a pair of lens arrays 171, 172. The pair of lens arrays 171, 172 are each formed of a plurality of lenses arranged in an array. The illumination light WL having been emitted from the integrator optical system 17 enters the polarization conversion element 18.

The polarization conversion element 18 is constituted by a polarization split film and a wave plate, and converts the illumination light WL into linearly polarized light. The illumination light WL having been emitted from the polarization conversion element 18 enters the superimposing lens 19. The superimposing lens 19 superimposes the illumination light WL on the image forming areas of the respective light modulation devices 400R, 400G, and 400B as the illumination target areas to thereby homogenize the illuminance distribution of the illumination target areas.

The configuration of the wavelength conversion element 4 will hereinafter be described.

As shown in FIG. 2, the wavelength conversion element 4 is provided with a base member 10 and a phosphor layer (a wavelength conversion layer) 11. The base member 10 has an obverse surface 10a located on the pickup optical system 16 side, and a reverse surface 10b facing opposite to the obverse surface 10a. The wavelength conversion element 4 is further provided with a reflecting layer 12 and a heat radiation member 26, wherein the reflecting layer 12 is disposed between the obverse surface 10a of the base member 10 and the phosphor layer 11, and the heat radiation member 26 is disposed on the reverse surface 10b of the base member 10.

In the present embodiment, as a material of the base member 10, a material high in thermal conductivity and excellent in heat radiation property is preferably used, and there can be cited, for example, metal such as aluminum or copper, or ceramics such as aluminum nitride, alumina, sapphire, or diamond.

In the present embodiment, the phosphor layer 11 is held on the obverse surface 10a of the base member 10 via a fixation member 13. The phosphor layer 11 converts a part of the incident light into the fluorescence YL and then emits the fluorescence YL, and at the same time, emits another part thereof without being converted into the fluorescence YL. Further, the reflecting layer 12 reflects the incident light from the phosphor layer 11 toward the pickup optical system 16.

The heat radiation member 26 has, for example, a structure formed of a heatsink having a plurality of fins 26a. The heat radiation member 26 is disposed on the reverse surface 10b facing opposite to the phosphor layer 11 in the base member 10. It should be noted that the heat radiation member 26 is fixed to the base member 10 with, for example, bonding (metal bonding) using metal brazing.

Figure 3:
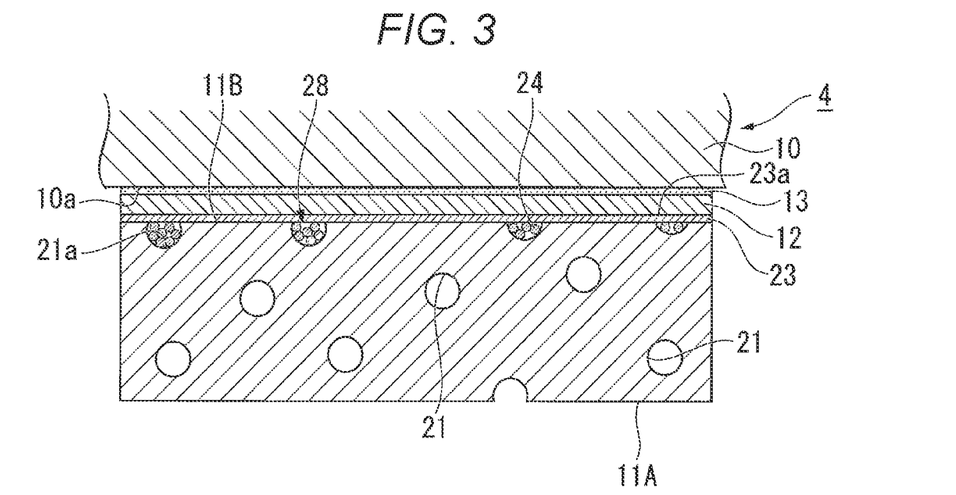
FIG. 3 is a cross-sectional view showing a configuration of an essential part of a wavelength conversion element.

FIG. 3 is a cross-sectional view showing a configuration of an essential part of the wavelength conversion element 4.

As shown in FIG. 3, the phosphor layer 11 has a light exit surface 11A and a bottom surface 11B. The light exit surface 11A is a surface through which the blue light BLc enters the phosphor layer 11, and at the same time, the fluorescence YL is emitted in FIG. 2. The bottom surface 11B is a surface opposed to the base member 10. It should be noted that in FIG. 3, in order to make the description easy to understand, the wavelength conversion element 4 is illustrated in a state in which the bottom surface 11B faces upward.

In the present embodiment, the phosphor layer 11 is formed by calcining phosphor particles. As the phosphor particles constituting the phosphor layer 11, there is used a YAG (Yttrium Aluminum Garnet) phosphor including Ce ions. It should be noted that the constituent material of the phosphor particles can be unique, or it is also possible to use a mixture of the particles formed using two or more types of materials. As the phosphor layer 11, there is preferably used a phosphor layer having the phosphor particles dispersed in an inorganic binder such as alumina, a phosphor layer formed by calcining a glass binder as an inorganic material and the phosphor particles, or the like.

A plurality of air holes 21 is disposed inside the phosphor layer 11. The phosphor layer 11 has a light scattering property due to the plurality of air holes 21. The plurality of air holes 21 is formed of, for example, air holes with the average particle diameter of about 60 µm.

Some of the air holes 21 are exposed on the bottom surface (a first surface) 11B forming an obverse surface of the phosphor layer 11. On the bottom surface 11B of the phosphor layer 11, there are disposed recessed parts 21a formed of the air holes 21. The wavelength conversion element 4 according to the present embodiment has a plurality of particles 24 and a light transmissive member 23.

The plurality of particles 24 is disposed in the recessed parts 21a. It is sufficient for the material of the particles 24 to be a member difficult to absorb light, and it is possible to use, for example, a light transmissive member, a reflecting member, or a wavelength conversion member as the material of the particles 24. As the light transmissive member, it is possible to use, for example, colloidal silica, alumina, glass particles, GaN, YAlO$_3$ (YAP), or YAG without Ce ions. As the reflecting member, it is possible to use, for example, Al. As the wavelength conversion member, it is possible to use phosphor particles. It should be noted that the particles 24 can be formed of a material getting into the recessed parts 21a in the process of manufacturing the wavelength conversion element 4 as described later.

The particle diameter of the particles 24 is not particularly limited as long as the particle 24 can be housed in the recessed part 21a. For example, the relationship between the size of the particle 24 and the size of the air hole 21 is set so that it becomes possible to dispose at least two particles 24 in the air hole 21.

In the wavelength conversion element 4 according to the present embodiment, a part of the fluorescence generated in the phosphor layer 11 is totally reflected on the interface with the air hole 21 and is then scattered. Since the particles 24 disposed in the air holes 21 are formed of a member difficult to absorb the light as described above, it is possible to reduce the occurrence of the energy loss due to the absorption of the fluorescence.

The light transmissive member 23 is disposed so as to cover the recessed parts 21a and the particles 24. In the present embodiment, it is possible for a part of the light transmissive member 23 to get into the recessed parts 21a to thereby be disposed in a state of having contact with the particles 24. Further, it is possible for the light transmissive member 23 to be disposed, for example, in a state of not having contact with the particles 24 without getting into the recessed parts 21a.

In the wavelength conversion element 4 according to the present embodiment, the size of exposed air holes 28 exposed on the obverse surface (the bottom surface 11B) of the phosphor layer 11 is reduced due to the plurality of particles 24 disposed in the recessed parts 21a. Since the light transmissive member 23 is disposed on the bottom surface 11B so as to fill in or close the exposed air holes 28, the light transmissive member 23 is in the state of being prevented from getting into the exposed air holes 28. The surface 23a of the light transmissive member 23 in the present embodiment is formed as a substantially flat surface without a hole. Here, the substantially flat surface denotes the flatness enough for forming the reflecting layer 12 on the surface 23a with the vapor deposition or the like in good condition, and microscopic unevenness with which the reflecting layer 12 can be deposited is allowed.

As the material of the light transmissive member 23, there is used an inorganic material having a light transmissive property such as alumina, Y$_3$Al$_5$O$_{12}$, YAlO$_3$, zirconium dioxide, Lu$_3$Al$_5$O$_{12}$, or SiO$_2$ (glass paste), or an anaerobic adhesive. In the present embodiment, SiO$_2$ is used as the light transmissive member 23.

The wavelength conversion element 4 according to the present embodiment has the reflecting layer 12 disposed on the light transmissive member 23. The reflecting layer 12 is disposed so as to be opposed to the bottom surface 11B of the phosphor layer 11 via the light transmissive member 23. The reflecting layer 12 is deposited by, for example, vapor deposition. The reflecting layer 12 includes a reflecting film made of, for example, Al or Ag, and a dielectric multilayer film.

The reflecting layer 12 is held on the base member 10 via the fixation member 13. As the bonding method with the fixation member 13, it is preferable to use bonding (metal bonding) with metal brazing such as silver solder. Thus, it is possible to improve the thermal conductivity between the reflecting layer 12 and the base member 10.

In the present embodiment, on the light exit surface 11A of the phosphor layer 11, there is formed an antireflection film (an AR coat film) not shown. It should be noted that the light exit surface 11A can be provided with recessed parts by partially exposing the air holes 21 similarly to the bottom surface 11B, or can also be provided with no recessed part.

Then, a manufacturing process of the wavelength conversion element 4 according to the present embodiment will be described.

FIG. 4A through FIG. 4E are diagrams showing a part of the manufacturing process of the wavelength conversion element 4.

Figure 4A:
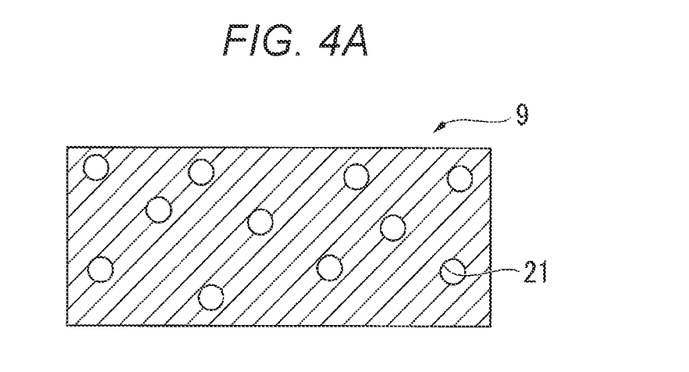
FIG. 4A is a diagram showing a part of a manufacturing process of the wavelength conversion element.

Firstly, the mixture constituted by the phosphor particles forming the phosphor layer 11 and an organic substance is prepared, and then the mixture is calcined at a predetermined temperature.

Due to the calcination, the organic substance evaporates, and as shown in FIG. 4A, there is formed the phosphor base member 9 including the plurality of air holes 21 and formed of the phosphor. It should be noted that the size or the number of the air holes 21 can be controlled by the calcination temperature, the material of the organic substance, and so on.

Figure 4B:
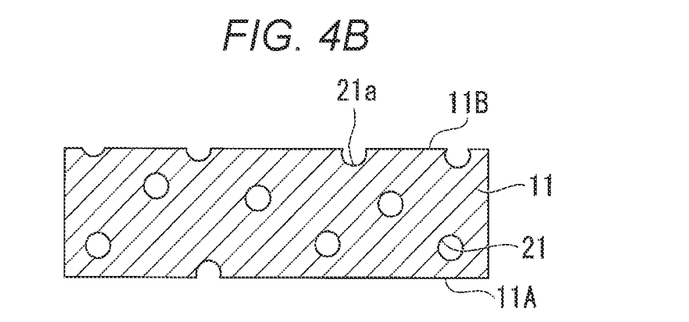
FIG. 4B is a diagram showing a part of the manufacturing process of the wavelength conversion element.

Subsequently, by grinding the both surfaces of the phosphor base member 9, the phosphor layer 11 having the light exit surface 11A and the bottom surface 11B is formed as shown in FIG. 4B. Due to the grinding process, some of the air holes 21 are exposed to the outside, and thus, the recessed parts 21a are formed on the bottom surface 11B of the phosphor layer 11.

Figure 4C:
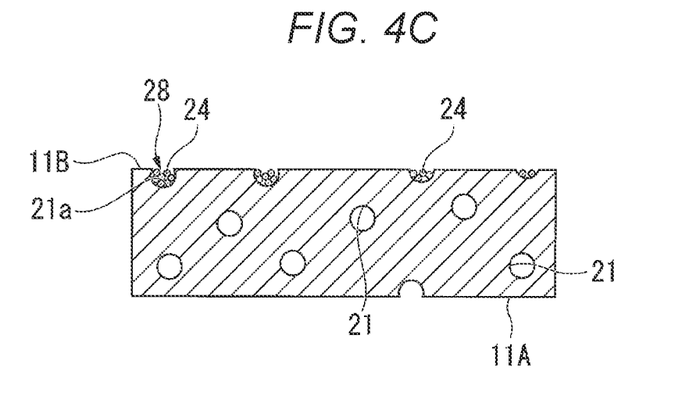
FIG. 4C is a diagram showing a part of the manufacturing process of the wavelength conversion element.

Subsequently, as shown in FIG. 4C, the plurality of particles 24 is disposed in the recessed parts 21a formed on the bottom surface 11B.

For example, it is possible to dispose the particles 24 in the recessed parts 21a by dropping or applying with a squeegee a solvent including the particles 24 dispersed in the recessed parts 21a, and then drying only the solvent.

Further, the plurality of particles 24 which is disposed on the bottom surface 11B can be disposed in the recessed parts 21a with the squeegee. Further, for example, the bottom surface 11B is directly scraped with a solid material obtained by solidifying a material forming the particles to generate chips of the solid material, and the chips of the solid material can be disposed in the recessed parts 21a as the particles 24.

It should be noted that in some cases, abrasive grains of a grinding stone used for the grinding or phosphor particles generated by the grinding get into the recessed parts 21a due to the grinding process described above. In the wavelength conversion element 4 according to the present embodiment, the abrasive grains or the phosphor particles which are generated in the grinding process described above and then get into the recessed parts 21a can be used as a part of the plurality of particles 24.

Figure 4D:
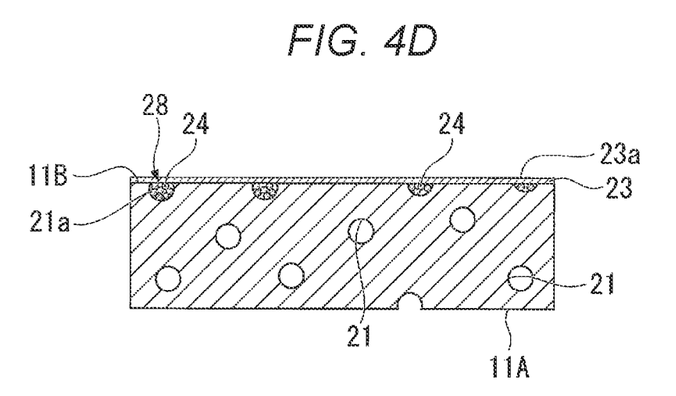
FIG. 4D is a diagram showing a part of the manufacturing process of the wavelength conversion element.

Subsequently, as shown in FIG. 4D, the light transmissive member 23 is disposed on the bottom surface 11B of the phosphor layer 11.

When the flatness of the bottom surface 11B is low, it becomes difficult to evenly deposit the light transmissive member 23. When the homogeneity of the light transmissive member 23 degrades, the homogeneity of the reflecting layer 12 disposed on the light transmissive member 23 degrades. Then, it becomes unachievable to efficiently reflect the fluorescence YL toward the light exit surface 11A, and therefore, the extraction efficiency of the fluorescence YL of the wavelength conversion element 4 decreases.

In the manufacturing process of the wavelength conversion element 4 according to the present embodiment, by disposing the plurality of particles 24 in the recessed parts 21a as shown in FIG. 4C, the size of the exposed air holes 28 exposed on the obverse surface (the bottom surface 11B) of the phosphor layer 11 is reduced in advance. Therefore, the light transmissive member 23 is disposed on the bottom surface 11B in the state of being prevented from getting into the exposed air holes 28. Therefore, the surface 23a of the light transmissive member 23 formed on the bottom surface 11B becomes the substantially flat surface without a hole.

The light transmissive member 23 can be deposited by any of dry deposition methods such as vapor deposition and sputtering, and wet deposition methods.

For example, when using the dry deposition method such as vapor deposition or sputtering, since it becomes easy to prevent the light transmissive member 23 from getting into the exposed air holes 28, it is possible to leave a lot of air layer in the exposed air hole 28. Thus, since the blue light BLc is efficiently reflected by the interface between the phosphor layer 11 and the air layer, it is possible to increase the wavelength conversion efficiency of the phosphor layer 11 by returning the blue light BLc to the inside of the phosphor layer 11.

Further, when using the wet deposition method, it becomes easy for the constituent material of the light transmissive member 23 to get into the exposed air holes 28 compared to the dry deposition method. Thus, it is possible to increase the contact area between the light transmissive member 23 and the phosphor layer 11 since the light transmissive member 23 gets into gaps between the particles 24 disposed in each of the recessed parts 21a. Therefore, since the heat of the phosphor layer 11 is efficiently transferred toward the base member 10 via the light transmissive member 23 to thereby suppress the rise in temperature of the phosphor layer 11, and thus, it is possible to reduce the decrease in the fluorescence emitting efficiency due to the thermal quenching. Further, by improving the heat radiation performance of the phosphor layer 11, the heat radiation member 26 can be reduced in size, and therefore, it is possible to reduce the size of the wavelength conversion element 4. Further, since the gaps between the particles 24 are filled with the light transmissive member 23, it becomes possible to increase the mechanical strength of the phosphor layer 11.

Figure 4E:
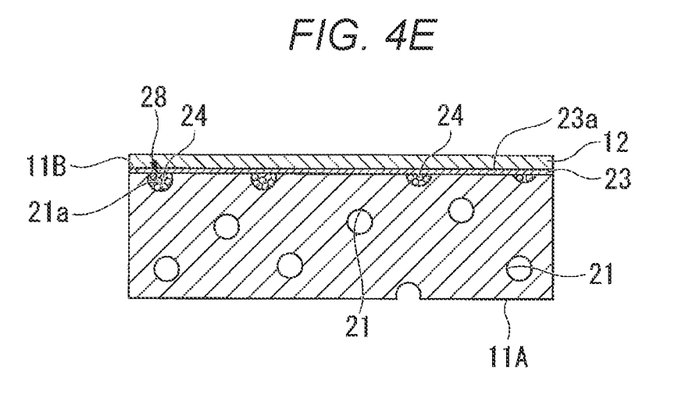
FIG. 4E is a diagram showing a part of the manufacturing process of the wavelength conversion element.

Subsequently, as shown in FIG. 4E, the reflecting layer 12 is formed on the surface 23a of the light transmissive member 23 using vapor deposition or sputtering. The reflecting layer 12 is formed on the surface 23a of the light transmissive member 23 as the substantially flat surface to thereby evenly be deposited. According to the manufacturing process of the wavelength conversion element 4 according to the present embodiment, it is possible to evenly deposit the reflecting layer 12 on the bottom surface 11B of the phosphor layer 11.

Subsequently, the stacked body of the reflecting layer 12 and the phosphor layer 11, and the base member 10 are fixed to each other via the fixation member 13. Lastly, by fixing the heat radiation member 26 to the surface on the opposite side to the phosphor layer 11 in the base member 10, the wavelength conversion element 4 according to the present embodiment is manufactured.

As described hereinabove, according to the wavelength conversion element 4 related to the present embodiment, since there is provided the reflecting layer 12 homogenously disposed so as to be opposed to the bottom surface 11B of the phosphor layer 11, the fluorescence YL having entered the bottom surface 11B can be reflected by the reflecting layer 12, which is homogenous, in good condition and then emitted from the light exit surface 11A. Therefore, it is possible for the wavelength conversion element 4 according to the present embodiment to improve the extraction efficiency of the fluorescence YL.

Therefore, according to the light source device 100A equipped with the wavelength conversion element 4, it is possible to provide the light source device, which reduces the loss of the fluorescence YL with respect to the intensity of the incident excitation light. Further, according to the projector 1 related to the present embodiment, since the illumination device 100 using the light source device 100A described above is provided, it is possible for the projector 1 to form a high-intensity image.

It should be noted that the present disclosure is not limited to the contents of the embodiments described above, but can arbitrarily be modified within the scope or the spirit of the present disclosure.

For example, although in the embodiment described above, there is cited the stationary element as an example of the wavelength conversion element 4, the wavelength conversion element according to the present disclosure can also be applied to a rotary wheel-type element.

Further, although in the embodiment described above, there are used the transmissive liquid crystal light valves as the light modulation devices, it is also possible to use reflective liquid crystal light valves as the light modulation devices. Further, it is also possible to use the light modulation devices other than the liquid crystal types such as devices using micromirrors such as DMD (Digital Micromirror Device) as the light modulation devices. Further, it is also possible to use an LED (Light Emitting Diode) besides the semiconductor laser diode as the light source of the illumination device.

Further, although in the embodiment described above, there is described the example of installing the light source device according to the present disclosure in the projector, this is not a limitation. The light source device according to the present disclosure can also be applied to lighting equipment, a headlight of a vehicle, and so on.

What is claimed is:

1. A wavelength conversion element comprising:
  a wavelength conversion layer that is constituted by a layer of calcined phosphor particles, and has a plurality of air holes disposed in the layer and a first surface having a plurality of surface recesses, and that is configured to be excited by light in a first wavelength band to thereby generate light in a second wavelength band different from the first wavelength band;

a plurality of particles disposed in each of the surface recesses;

a light transmissive layer disposed so as to cover directly each of the surface recesses, the particles in the surface recesses and the first surface except for the surface recesses;

a reflecting layer disposed so as to be contacted directly to the light transmissive layer; and a base layer disposed so as to be contacted to the reflecting layer.

2. A light source device comprising:

the wavelength conversion element according to claim 1; and a light source configured to emit the light in the first wavelength band toward the wavelength conversion element.

3. A projector comprising:

the light source device according to claim 2;

a light modulation device configured to modulate light from the light source device in accordance with image information to thereby form image light; and a projection optical system configured to project the image light.

4. A wavelength conversion element according to claim 1, wherein the sizes of the particles and holes are set so that it is possible for at least two particles to be disposed in each surface recess.

5. A wavelength conversion element according to claim 1, wherein the sizes of the holes have an average diameter of about 60 μm.

6. A wavelength conversion element according to claim 1, wherein the wavelength conversion layer, the reflecting layer, and the base layer comprise a stacked body fixed to each other via a bonding layer, with no separations between adjacent layers in the stacked body.

7. A wavelength conversion element according to claim 1, wherein the reflecting layer includes a reflecting film and a dielectric multilayer film.

8. A wavelength conversion element according to claim 1, wherein the material of the particle is a reflecting member.

9. A wavelength conversion element according to claim 1, wherein the material of the particle is at least one of colloidal silica, alumina, glass particles, GaN, $YAlO_3$ (YAP), YAG without Ce ions, or Al.

10. A wavelength conversion element according to claim 1, wherein the material of the particle is a light transmissive member.

* * * * *